United States Patent
Chang et al.

(10) Patent No.: US 12,197,745 B2
(45) Date of Patent: Jan. 14, 2025

(54) MEMORY DEVICE AND ASSOCIATED CONTROL METHOD

(71) Applicant: MACRONIX INTERNATIONAL CO., LTD., Hsinchu (TW)

(72) Inventors: Chin-Hung Chang, Tainan (TW); Chia-Jung Chen, Zhubei (TW); Ken-Hui Chen, Hsin Chu (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 174 days.

(21) Appl. No.: 17/817,711

(22) Filed: Aug. 5, 2022

(65) Prior Publication Data

US 2023/0251782 A1 Aug. 10, 2023

Related U.S. Application Data

(60) Provisional application No. 63/308,499, filed on Feb. 10, 2022.

(51) Int. Cl.
*G06F 3/06* (2006.01)

(52) U.S. Cl.
CPC .......... *G06F 3/0622* (2013.01); *G06F 3/0637* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 2012/0331560 A1* | 12/2012 | Chowdhury | G06F 12/1441 726/26 |
| 2019/0042476 A1* | 2/2019 | Chhabra | G06F 21/85 |
| 2020/0125742 A1* | 4/2020 | Kounavis | G06F 12/1458 |
| 2020/0257827 A1* | 8/2020 | Kounavis | H04L 9/0637 |
| 2020/0285498 A1* | 9/2020 | Keeth | G06F 21/6218 |

* cited by examiner

*Primary Examiner* — Stephanie Wu
(74) *Attorney, Agent, or Firm* — McClure, Qualey & Rodack, LLP

(57) ABSTRACT

A memory device and an associated control method are provided. The memory device includes a non-volatile memory array and a memory control circuit. The non-volatile memory array includes M secured memory zones. The memory control circuit is electrically connected to the non-volatile memory array. The memory control circuit provides a set of mapping information and searches a request key in the set of mapping information. The set of mapping information represents correspondences between N access keys and the M secured memory zones. The memory control circuit acquires at least one of the M secured memory zones if the request key is one of the N access keys, and performs an access command to the at least one of the M secured memory zones. M and N are positive integers.

18 Claims, 4 Drawing Sheets

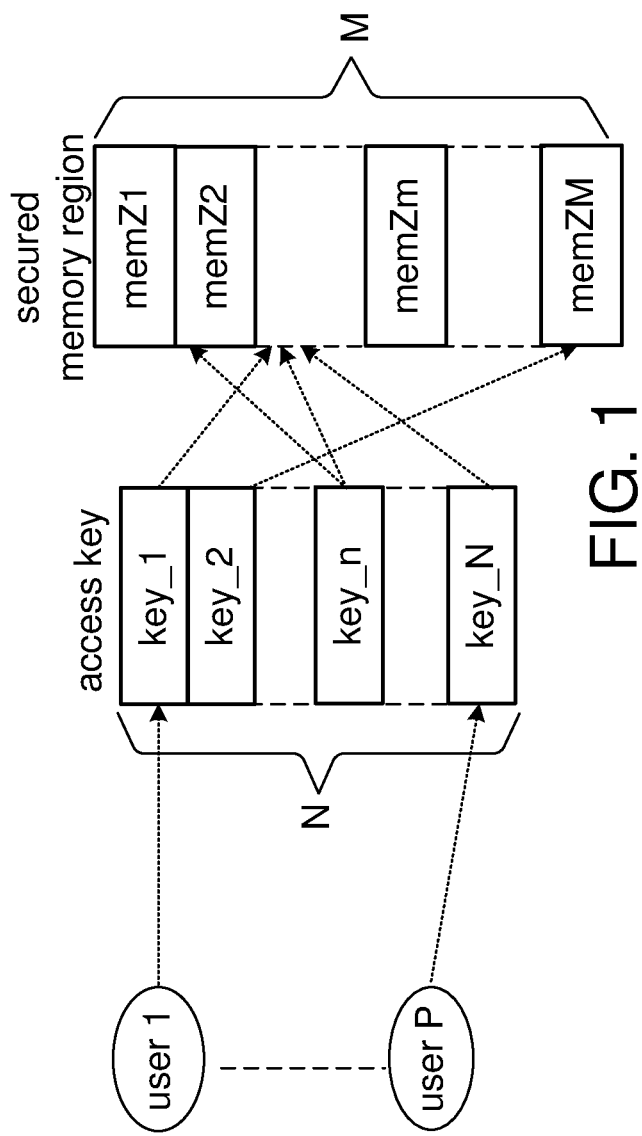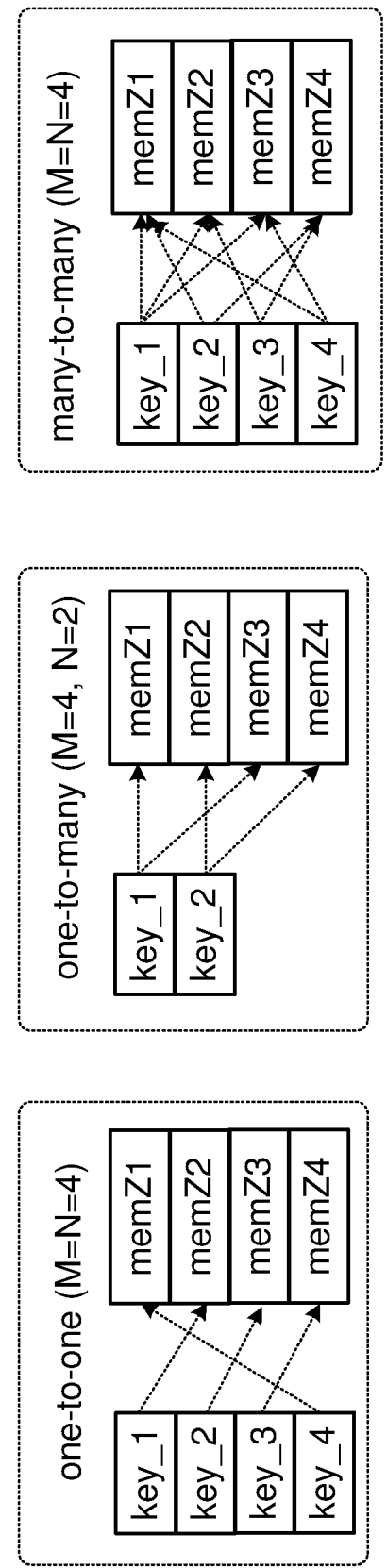

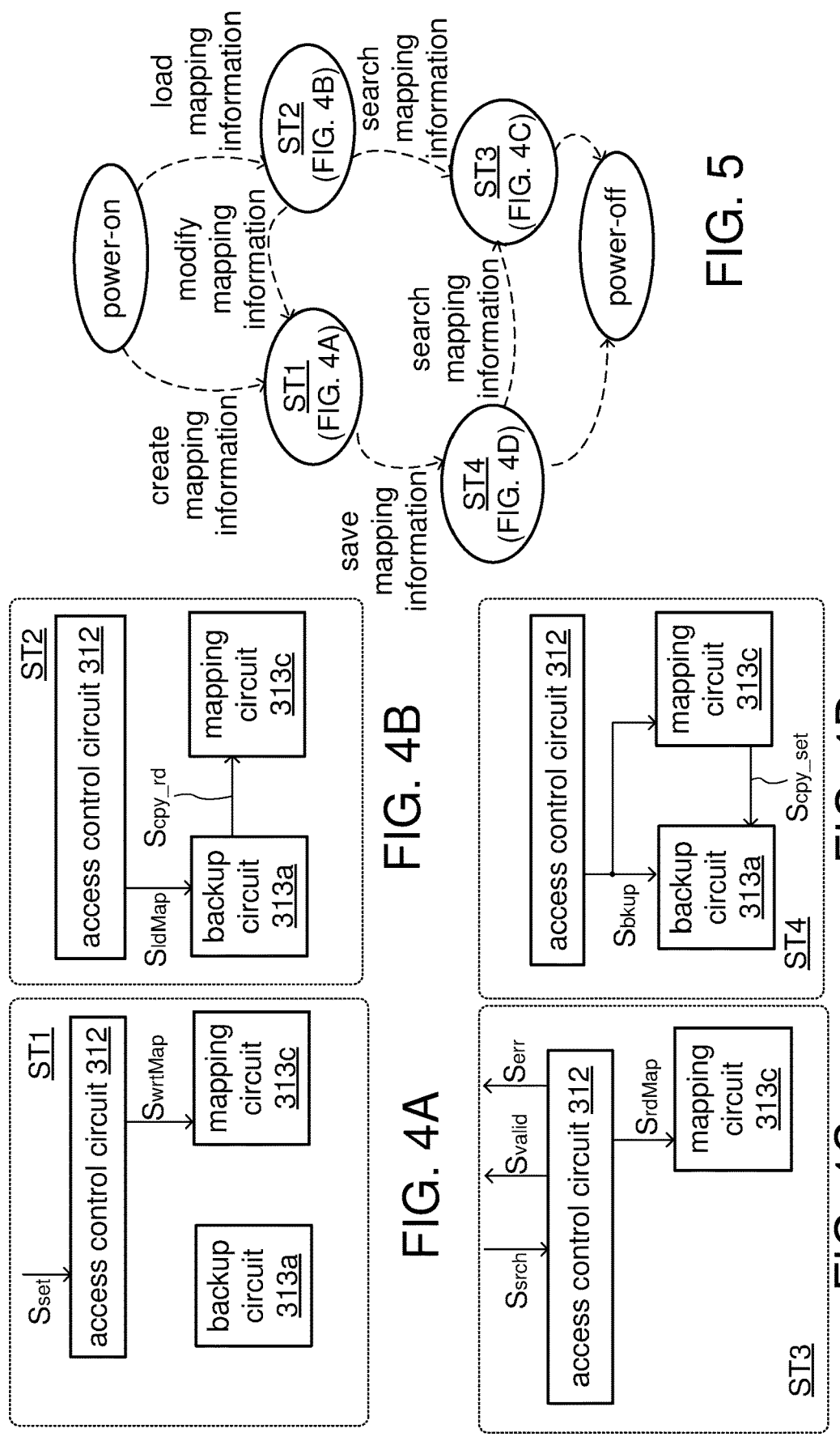

MEMORY DEVICE AND ASSOCIATED CONTROL METHOD

This application claims the benefit of U.S. provisional application Ser. No. 63/308,499, filed Feb. 10, 2022, the disclosure of which is incorporated by reference herein in its entirety.

TECHNICAL FIELD

The disclosure relates in general to a memory device and associated control method, and more particularly to a memory device and associated control method capable of managing different access authorities of a non-volatile memory array.

BACKGROUND

Data security is an important issue. On some occasions, a memory device might be accessed by different users, but the access authorities of these users might be different. Therefore, it is desired to have a memory device capable of providing different access authorities to different users.

SUMMARY

The disclosure is directed to a memory device and associated control method capable of managing different access authorities of a non-volatile memory array. The memory device is equipped with a mapping circuit in which mapping information is stored. Based on the mapping information, the correspondences of different access keys and secured memory zones are acquired. Consequentially, the memory device could manage the access authority control, and data security can be ensured.

According to one embodiment, a memory device is provided. The memory device includes a non-volatile memory array and a memory control circuit. The non-volatile memory array includes M secured memory zones. The memory control circuit is electrically connected to the non-volatile memory array. The memory control circuit provides a set of mapping information and searches a request key in the set of mapping information. The set of mapping information represents correspondences between N access keys and the M secured memory zones. The memory control circuit acquires at least one of the M secured memory zones if the request key is one of the N access keys and performs an access command to the at least one of the M secured memory zones. M and N are positive integers.

According to another embodiment, a control method is provided. The control method is applied to a memory device having a non-volatile memory array, and the non-volatile memory array includes M secured memory zones. The control method includes the following steps. Firstly, a set of mapping information representing correspondences between N access keys and the M secured memory zones is provided. Then, a request key is searched in a set of mapping information. At least one of the M secured memory zones is acquired if the request key is one of the N access keys. Later, an access command is performed to the at least one of the M secured memory zones. M and N are positive integers.

BRIEF DESCRIPTION OF THE DRAWINGS

FIG. 1 is a schematic diagram illustrating a possible application scenario of a memory device in which multiple users have different access authorities to multiple secured memory zones memZ1~memZM.

FIG. 2A is a schematic diagram illustrating that access keys and memory zones are mapped based on a one-to-one mapping.

FIG. 2B is a schematic diagram illustrating that access keys and memory zones are mapped based on a one-to-many mapping.

FIG. 2C is a schematic diagram illustrating that access keys and memory zones are mapped based on a many-to-many mapping.

FIGS. 4A, 4B, 4C, and 4D are schematic diagrams illustrating different operation states of the access control circuit, the backup circuit, and the mapping circuit.

FIG. 5 is a state diagram illustrating possible state transitions of the memory device for accessing the secured access region.

Figure 3:
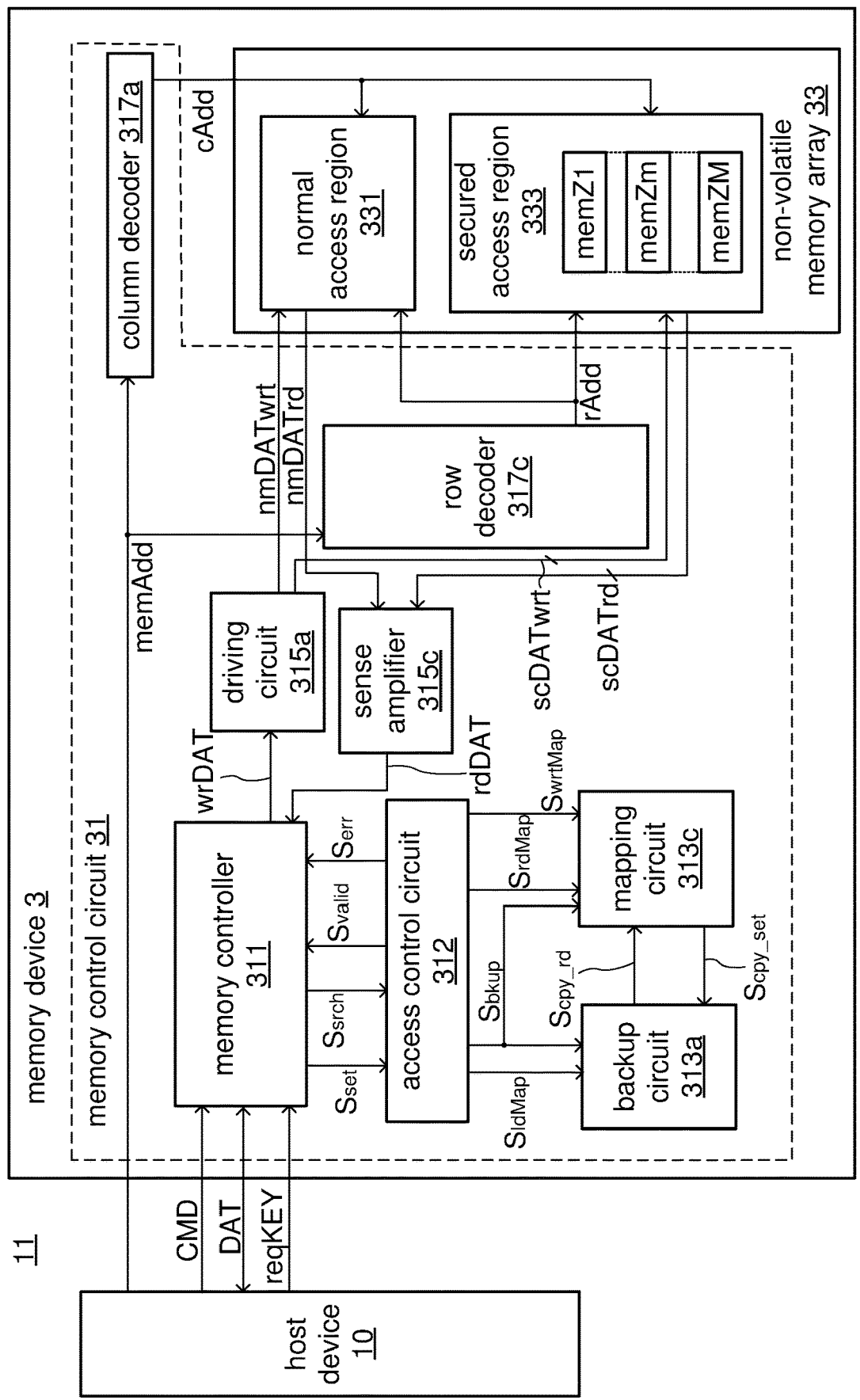
FIG. 3 is a block diagram schematically illustrating a memory device according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

As illustrated above, there is a need to develop a memory device having different access authorities for multi-entity applications. The memory device, according to the embodiment of the present disclosure, provides such a function. In the following, the mapping mechanism provided by the memory device, the block diagram of the memory device, and the operations of the memory device are respectively introduced.

FIG. 1 is a schematic diagram illustrating a possible application scenario of a memory device in which multiple users have different access authorities to multiple secured memory zones memZ1~memZM. FIG. 1 includes three parts. The left part represents that P users can access a memory device, and the middle part represents that N access keys key_1~key_N are defined for access control. The right part represents that a secured access region is divided into M secured memory zones memZ1~memZM. The variables P, M, and N are positive integers.

The P users may operate a host device separately, and the host device provides multi-entity applications. The correspondences between the P users and the N access keys key_1~key_N are flexible and defined by the host device. In the specification, mapping relationships between the N access keys key_1~key_N and the M secured memory zones memZ1~memZM are concerned. On the other hand, details about the mapping relationships between the N access keys key_1~key_N and the P users are not described. For the sake of illustration, it can be assumed that P=N.

Depending on the applications, the values of the variables M and N might change. FIGS. 2A, 2B, and 2C demonstrate different types of mapping relationships between the variables M and N.

FIG. 2A is a schematic diagram illustrating that access keys and memory zones are mapped based on a one-to-one mapping. In FIG. 2A, an exemplary one-to-one mapping is shown, and it is assumed that M=N=4.

The access key key_1 corresponds to the secured memory zone memZ2, the access key key_2 corresponds to the secured memory zone memZ3, the access key key_3 corresponds to the secured memory zone memZ4, and the access key key_4 corresponds to the secured memory zone memZ1. That is, each of the access key key_1~key_4 corresponds to one of the secured memory zones memZ1 memZ4, and each of the secured memory zones memZ1 memZ4 corresponds to one of the access keys key_1~key_4. When the correspondences are based on a one-to-one mapping, the variables M and N are equivalent.

FIG. 2B is a schematic diagram illustrating that access keys and memory zones are mapped based on a one-to-many mapping. In FIG. 2B, an exemplary one-to-many mapping is shown, and it is assumed that M=4 and N=2.

The access key key_1 corresponds to the secured memory zones memZ1, memZ3, and the access key key_2 corresponds to the secured memory zones memZ1, memZ2, memZ3, memZ4. That is, each of the access keys key_1, key_2 corresponds to more than one secured memory zones memZ1 memZ4, and each of the secured memory zones memZ1 memZ4 corresponds to one of the access keys key_1, key_2. When the correspondences are based on a one-to-many mapping, the variable N is smaller than the variable M (N<M).

FIG. 2C is a schematic diagram illustrating that access keys and memory zones are mapped based on a many-to-many mapping. In FIG. 2B, a one-to-many mapping is shown, and it is assumed that M=4 and N=2.

The access key key_1 corresponds to the secured memory zones memZ1, memZ2, memZ3, the access key key_2 corresponds to the secured memory zones memZ1, memZ4, the access key key_3 c corresponds to the secured memory zones memZ2, memZ4, and the access key key_4 corresponds to the secured memory zones memZ1, memZ3. That is, each of the access keys key_1~key_4 corresponds to more than one secured memory zones, and each of the secured memory zones memZ1 memZ4 corresponds to more than one access key key_1~key_4. When the correspondences are based on a many-to-many mapping, the variables M and N might be satisfied with different equations (M>N, M<N, or M=N).

The memory device, according to the present disclosure, performs a mapping creation procedure and a mapping search procedure. During the mapping creation procedure, a set of mapping information showing mapping relationships (correspondences) between the access key key_1~key_N and the secured memory zones memZ1~memZM is created. The base or the plan of the mapping relationship can be determined by an administrator user or by the manufacturer of the memory device. In the mapping search procedure, the set of mapping information is referred to access the memory array to ensure that the users access the memory array in accordance with suitable/preset authorities.

Please note that the patterns and formats of the mapping information may represent different types of mapping relationships between the access keys key_1~key_N and the secured memory zones memZ1~memZM, as those described in FIGS. 2A, 2B, and 2C. More details about the patterns and formats of the mapping information are described in FIGS. 6A and 6B.

FIG. 3 is a block diagram schematically illustrating an electronic device having a memory device according to an embodiment of the present disclosure. The electronic device 11 includes a host device 10 and a memory device 3. The memory device 3 is electrically connected to the host device 10, and the memory device 3 operates in response to inquiries from the host device 10. In practical applications, the electronic device 11 can be a personal computer, a laptop, a mobile, a pad, a digital camera, and so forth.

The memory device 3 includes a memory control circuit 31 and a non-volatile memory array 33. The memory control circuit 31 is electrically connected to the host device 10 and the non-volatile memory array 33. The type of the non-volatile memory array 33 is not limited. For example, the non-volatile memory array 33 can be a NOR-flash memory array, a NAND-flash memory array, and so forth.

The non-volatile memory array 33 includes a normal access region 331 and a secured access region 333. The normal access region 331 and the secured access region 333 have multiple memory zones. In some applications, the sizes of the memory zones can be equivalent (for example, 4 Mb). In some applications, the sizes of the memory zones are not necessary to be equivalent.

The memory zones in the normal access region 331 can be freely accessed by any user. Detailed descriptions about the access of the normal access region 331 are omitted.

On the other hand, the access authorities corresponding to the memory zones in the secured access region 333 are limited. In short, when a user wants to access the memory zones in the secured access region 333, the host device 1 needs to transmit a request key reqKEY to the memory device 3. The request key reqKEY represents the access authority corresponding to the user. Then, the memory control circuit 31 identifies if the request key reqKEY can be found in a preset and pre-stored set of mapping information. If so, the user is authorized to access the memory zones in the secured access region 333, and vice versa.

The memory control circuit 31 includes a memory controller 311, an access control circuit 312, a mapping circuit 313c, a backup circuit 313a, a driving circuit 315a, a sense amplifier 315c, a column decoder 317a, and a row decoder 317c. In practical applications, the memory control circuit 31 may further include other components such as a high-voltage generator for providing programming or erasing voltages, a buffer circuit for data reading or writing, a pair of encryption and decryption circuits, and so forth.

The memory controller 311, the driving circuit 315a, the sense amplifier 315c, the column decoder 317a, and the row decoder 317c are related to both the normal access region 331 and the secured access region 333. On the other hand, the access control circuit 312, the backup circuit 313a, and the mapping circuit 313c are related to the secured access region 333 only.

The memory controller 311 is electrically connected to the host device 10, the driving circuit 315a, and the sense amplifier 315c. The driving circuit 315a is electrically connected to the normal access region 331 and the secured access region 333. The communication interface between the host device 10 and the memory controller 311 is related to the memory type of the memory device 3. For example, the serial peripheral interface (hereinafter, SPI) NOR-flash protocol can be adopted if the non-volatile memory array 33 is a NOR-flash array. The command signal CMD represents the type of command to be sent from the host device 10 to the memory controller 311, and the data signal DAT is a bidirectional signal representing data to be transmitted between the host device 10 and the memory device 3.

For example, the command signal CMD may represent a write command, and the data signal DAT represents data to be transmitted from the host device 10 to the memory controller 311. Alternatively, the command signal CMD may represent a read command, and the data signal DAT represents data to be transmitted from the memory controller 311 to the host device 10. In practical applications, the command signal CMD and the data signal DAT might be transmitted with different signal lines or the same signal lines.

When the host device 10 sends a write data wrDAT and a write command to the memory controller 311, the memory controller 311 transmits the write data wrDAT to the driving circuit 315a. Then, the driving circuit 315a drives normal write data nmDATwrt to program the memory cells in the normal access region 331 or drives secured write data scDATwrt to program the memory cells in the secured access region 333. The locations of the memory cells are specified by the memory address memAdd.

When the host device 10 sends a read command to the memory controller 311, the sense amplifier 315c reads normal read data nmDATrd from the memory cells in the normal access region 331 or reads secured read data scDATrd from the secured access region 333. The locations of the memory cells are specified by the memory address memAdd.

The column decoder 317a and the row decoder 317c are electrically connected to the host device 10. From the host device 10, the column decoder 317a and the row decoder 317c receive the memory address memAdd. The column decoder 317a transforms the memory address memAdd to a column address cAdd, and the row decoder 317c transforms the memory address memAdd to a row address rAdd. Based on the column address cAdd and the row address rAdd, the memory cells in the non-volatile memory array 33 are accessed.

According to the embodiment of the present disclosure, the host device 10 selectively transmits a request key reqKEY to the memory controller 311, depending on which of the access regions is accessed. When the host device 10 wants to access the normal access region 311, the host device 10 does not need to transmit the request key reqKEY to the memory controller 311. Under such circumstances, the memory controller 311 directly notifies the driving circuit 315a, the sense amplifier 315c, the column decoder 317a, and the row decoder 317c to proceed with the access command.

Otherwise, the host device 10 must first transmit the request key reqKEY to the memory controller 311 if the secured access region 333 is accessed. Under such circumstances, the memory controller 311 cannot directly perform the write command nor the read command. Instead, the memory controller 311 should send a mapping search signal $S_{srch}$ to the access control circuit 312, and the access control circuit 312 proceeds with a mapping search procedure.

To manage the access of the secured access region 333, several supplemental signals are provided and utilized in the mapping creation procedure and the mapping search procedure. For example, a map setting signal $S_{set}$, an error notice signal $S_{err}$, a mapping search signal $S_{srch}$, and a valid signal $S_{valid}$ are utilized between the memory controller 311 and the access control circuit 312; a map loading signal $S_{ldmap}$ and a backup signal $S_{bkup}$ are utilized between the access control circuit 312 and the backup circuit 313a; the backup signal $S_{bkup}$, a map reading signal $S_{rdMap}$, and a map writing signal $S_{wrtMap}$ are provided between the access control circuit 312 and the mapping circuit 313c, and a replica read signal $S_{cpy\_rd}$, and a replica setting signal $S_{cpy\_set}$ are provided between the backup circuit 313a and the mapping circuit 313c. The usages of these signals are described in FIGS. 4A, 4B, 4C, and 4D.

After the mapping search procedure is executed, the access control circuit 312 transmits a valid signal $S_{valid}$ to the memory controller 311 to inform whether the request key reqKEY is valid or not. Moreover, the memory controller 311 notifies the column decoder 317a, the row decoder 317c, the driving circuit 315a, and the sense amplifier 315c to proceed access to the secured access region 333 only if the valid signal $S_{valid}$ shows that the request key reqKEY has its corresponding secured memory zone.

In practical applications, the timing of creating the mapping information is not limited. For example, the mapping creation procedure might be performed while manufacturing the memory device 3. Or, the mapping creation procedure might be performed by an administrator user before other users start to use the memory device 3. Alternatively, the administrator user might want to modify the mapping information and controls the memory device 3 to perform the mapping creation procedure again.

The operations of the access control circuit 312, the backup circuit 313a, and the mapping circuit 313c are classified into different operation states (ST1~ST4). FIGS. 4A, 4B, 4C, and 4D respectively correspond to these operation states, and FIG. 5 shows the transitions between these operation states ST1~ST4.

FIGS. 4A, 4B, 4C, and 4D are schematic diagrams illustrating different operation states of the access control circuit, the backup circuit, and the mapping circuit. As shown in FIGS. 4A, 4B, 4C, and 4D, the signals transmitted between the host device 10, the access control circuit 312, the backup circuit 313a, and the mapping circuit 313c are changed with different operation states of the memory device 3.

At the operation state one ST1 (FIG. 4A), the mapping information is created. With the command signal CMD, the host device 10 issues a map setting command to the memory controller 311. In response to the map setting command, the memory controller 311 generates the map setting signal $S_{set}$. The access control circuit 312 receives the map setting signal $S_{set}$ from the memory controller 311 and generates the map writing signal $S_{wrtMap}$ to the mapping circuit 313c. With the map setting signal $S_{set}$, the memory controller 311 gradually and respectively transmits the planned mapping relationships between the access keys key_1~key_N and the secured memory zones memZ1~memZM to the mapping circuit 313c. Later, the mapping information is created and stored at the mapping circuit 313c.

At the operation state two ST2 (FIG. 4B), the access control circuit 312 transmits the map loading signal $S_{ldMap}$ to the backup circuit 313a. Then, the mapping information stored at the backup circuit 313a is copied to the mapping circuit 313c, through the replica read signal $S_{cpy\_rd}$.

At the operation state three ST3 (FIG. 4C), the access control circuit 312 receives the mapping search signal $S_{srch}$ from the memory controller 311. The mapping search signal $S_{srch}$ carries the request key reqKEY, and the access control circuit 312 searches the mapping information to find out whether the request key reqKEY exists in the mapping information with the map reading signal $S_{rdMap}$. If so, a secured memory zone corresponding to the request key reqKEY can be identified and acquired.

If the access control circuit 312 can successfully acquire a secured memory zone corresponding to the request key reqKEY from the mapping information, the access control circuit 312 transmits the valid signal $S_{valid}$ to the memory controller 311. Otherwise, the access control circuit 312 transmits the error notice signal $S_{err}$ to the memory controller 311 to inform that the request key reqKEY does not have access authority to the memory device 3. To avoid an erroneous situation where the memory address sent by the host device 10 does not match the address range of the secured memory zone corresponding to the request key reqKEY, the access control circuit 312 might send the error notice signal $S_{err}$ to the memory controller 311 as well.

At the operation state four ST4 (FIG. 4D), the access control circuit 312 transmits the backup signal $S_{bkup}$ to the backup circuit 313a and the mapping circuit 313c. Then, the mapping information is copied from the mapping circuit 313c to the backup circuit 313a with the replica setting signal $S_{cpy\_set}$. As the backup circuit 313a is implemented with non-volatile memory circuits, the mapping information can be permanently reserved and referred to later.

For security issues, the access control circuit 312 may lock the backup circuit 313c after the mapping information has been saved at the backup circuit 313c in some applications. That is, the mapping information cannot be modified afterward. In some applications, the access control circuit 312 may not need to lock the backup circuit 313c after the mapping information has been saved at the backup circuit 313c. The manufacturer or the user of the memory device can freely determine whether to activate the lock function.

FIG. 5 is a state diagram illustrating possible state transitions of the memory device for accessing the secured access region. Please refer to FIGS. 4A-4D and 5 together. In FIG. 5, the ellipses represent the operation states ST1~ST4 of the memory device 3, and the dotted arrows represent transition directions between the operation states ST1~ST4.

After the memory device 3 is power-on, the memory device 3 selects to perform the mapping creation procedure or the mapping search procedure. The mapping creation procedure and the mapping search procedure are initiated by the host device 10 and performed by the memory device 3.

If the host device 10 wants to initiate the authority access control mechanism, the memory controller 311 needs to perform the mapping creation procedure, and the memory device 3 enters the operation state one ST1 (see FIG. 5). Or if the host device 10 wants to access the memory device 3, the memory controller 311 needs to perform the mapping search procedure to verify if the access can be authorized. Thus, the memory controller 311 needs to load the mapping information from the backup circuit 313a, and the memory device 3 enters the operation state two ST2 (see FIG. 4B). After the mapping information is loaded, the memory device 3 starts to use the mapping information provided by the mapping circuit 313c and enters the operation state three ST3 (see FIG. 4C). Later, the memory device 3 changes from the operation state three ST3 to power-off.

Sometimes, the administrator user might want to modify the mapping information. Under such circumstances, the memory device 3 changes from the operation state two ST2 (see FIG. 4B) to the operation state one ST1 (see FIG. 4A). After the operation state one (ST1) is complete, the memory device 3 stores the mapping information to the backup circuit 313a and enters the operation state four ST4 (see FIG. 4D). Then, the memory device 3 might be powered off or starts to use the mapping information. That is, the memory device 3 may change from the operation state four ST4 (see FIG. 4D) to the operation state three ST3 (see FIG. 4C).

Please note that the modification of the mapping information might not be performed globally but regionally. It is possible to modify only some, not all of the mapping relationships. For example, in an originally loaded mapping information, the access key key_1 corresponds to two secured memory regions. After the modification, the address key key_1 corresponds to five secured memory regions. The modifications of the mapping information can be freely determined according to the actual needs of the administrator user.

Figure 6A:
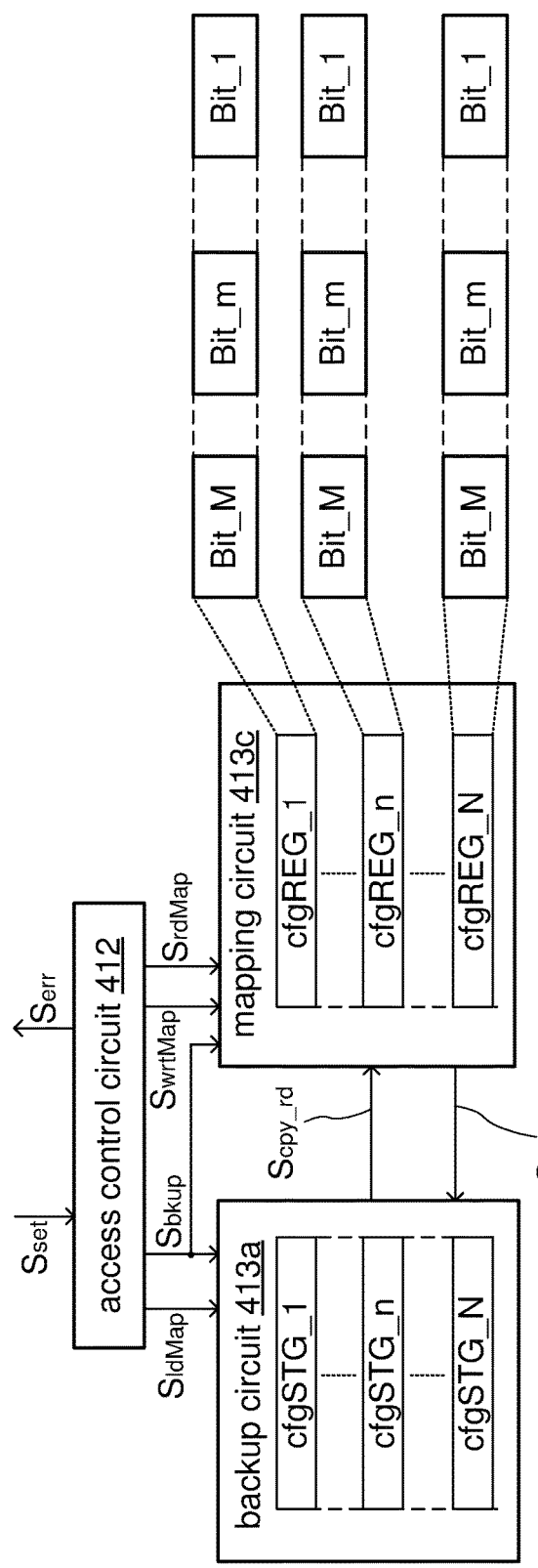
FIG. 6A is a schematic diagram illustrating that the mapping circuit and the backup circuit have an access-key centralized layout.

According to the embodiments of the present disclosure, the mapping information can be represented with different patterns. FIG. 6A illustrates that the mapping information may support the mapping relationships shown in FIGS. 2A, 2B, and 2C, and FIG. 6B illustrates that the mapping information may support the mapping relationships shown in FIGS. 2A and 2B.

According to the embodiment of the present disclosure, the backup circuit 313a further includes multiple configuration storage circuits, and the mapping circuit 313c further includes multiple configuration setting circuits. The configuration storage circuits are implemented with non-volatile memories (for example, NOR-flash, NAND-flash, and so forth), and the configuration setting circuits are implemented with volatile memories (for example, registers, latches, static random access memories, and so forth).

Figure 6B:
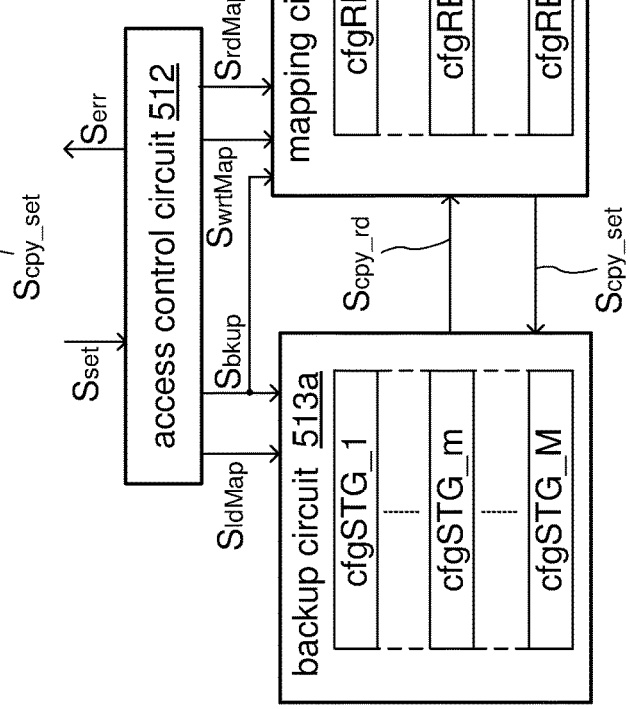
FIG. 6B is a schematic diagram illustrating that the mapping circuit and the backup circuit have a memory-zone centralized layout.

The layouts of the configuration storage circuits and the configuration setting circuits are similar, and the number of the configuration storage circuits and the configuration setting circuits are changed with the format of the mapping information to be stored. FIGS. 6A and 6B demonstrate two possible layouts of the configuration storage circuits and the configuration setting circuits. In practical applications, implementations and layouts of the configuration storage circuits and the configuration setting circuits are not limited.

FIG. 6A is a schematic diagram illustrating that the mapping circuit and the backup circuit have an access-key centralized layout. The backup circuit 413a includes N configuration storage circuits cfgSTG_1~cfgSTG_N, and the mapping circuit 413c includes N configuration setting circuits cfgREG1~cfgREG_N. The configuration storage circuits cfgSTG_1~cfgSTG_N correspond to N access keys key_1~key_N, and the configuration setting circuits cfgREG1~cfgREG_N correspond to N access keys key_1~key_N.

In FIG. 6A, each of the configuration storage circuits cfgSTG_1~cfgSTG_N includes M bits, so as the configuration setting circuits cfgREG1~cfgREG_N. At the right side of FIG. 6A, the configuration setting circuits cfgREG_1, cfgREG_n, cfgREG_N are shown as examples.

Table 1 shows a set of exemplary values stored at the configuration setting circuits cfgREG1~cfgREG_N. In Table 1, it is assumed that M=8 and N=4.

TABLE 1

| configuration setting circuit (access key) | secured memory zone | | | | | | | |
|---|---|---|---|---|---|---|---|---|
| | memZ8 Bit_8 | memZ7 Bit_7 | memZ6 Bit_6 | memZ5 Bit_5 | memZ4 Bit_4 | memZ3 Bit_3 | memZ2 Bit_2 | memZ1 Bit_1 |
| cfgREG_1 (key_1) | 0 | 1 | 0 | 1 | 0 | 1 | 0 | 0 |
| cfgREG_2 (key_2) | 0 | 0 | 1 | 0 | 0 | 0 | 0 | 0 |
| cfgREG_3 (key_3) | 0 | 0 | 0 | 0 | 1 | 0 | 0 | 1 |
| cfgREG_4 (key_4) | 0 | 1 | 1 | 1 | 1 | 1 | 1 | 1 |

Please refer to FIG. 6A and Table 1 together. The configuration setting circuits cfgREG_1~cfgREG_4 respectively correspond to the access keys key_1~key_4.

The 8 bits (0b 01010100) of the configuration setting circuit cfgREG_1 represent which of the secured memory zones memZ1~memZ8 can be accessed with the access key key_1. As the bits Bit_7, Bit_5, and Bit_3 of the configuration setting circuit cfgREG_1 are set (Bit_7=Bit_5=Bit_3=1), the user holding the access key key_1 has the authority to access the data stored at the secured memory zones memZ7, memZ5, memZ3, and the normal access region 331. As the bits Bit_8, Bit_6, Bit_4, Bit_2, and Bit_1 of the configuration setting circuit cfgREG_1 are not set (Bit_8=Bit_6=Bit_4=Bit_2=Bit_1=0), the user having the access key key_1 cannot access the data stored at the secured memory zones memZ8, memZ6, memZ4, memZ2, memZ1.

The 8 bits (0b 00100000) of the configuration setting circuit cfgREG_2 respectively represent which of the secured memory zones memZ1~memZ8 can be accessed with the access key key_2. As the bit Bit_6 of the configuration setting circuit cfgREG_2 is set (Bit_6=1), the user holding the access key key_2 has the authority to access the data stored at the secured memory zone memZ6 and the normal access region 331. As the bits Bit_8, Bit_7, Bit_5, Bit_4, Bit_3, Bit_2, Bit_1 of the configuration setting circuit cfgREG_2 are not set (Bit_8=Bit_7=Bit_5=Bit_4=Bit_3=Bit_2=Bit_1=0), the user having the access key key_2 cannot access the data stored at the secured memory zones memZ8, memZ7, memZ5, memZ4, memZ3, memZ2, memZ1.

The 8 bits (0b 00001001) of the configuration setting circuit cfgREG_3 respectively represent which of the secured memory zones memZ1 memZ8 can be accessed with the access key key_3. As the bits Bit_4, Bit_1 of the configuration setting circuit cfgREG_3 are set (Bit_4=Bit_1=1), the user holding the access key key_3 has the authority to access the data stored at the secured memory zone memZ4, memZ1, and the normal access region 331. As the bits Bit_8, Bit_7, Bit_6, Bit_5, Bit_3, and Bit_2 of the configuration setting circuit cfgREG_3 are not set (Bit_8=Bit_7=Bit_6=Bit_5=Bit_3=Bit_2=0), the user having the access key key_3 cannot access the data stored at the secured memory zones memZ8, memZ7, memZ6, memZ5, memZ3, and memZ2.

The 8 bits (0b 01111111) of the configuration setting circuit cfgREG_4 respectively represent which of the secured memory zones memZ1 memZ8 can be accessed with the access key key_4. As the bits Bit_7~Bit_1 of the configuration setting circuit cfgREG_4 are set (Bit_7=Bit_6=Bit_5=Bit_4=Bit_3=Bit_2=Bit_1=1), the user holding the access key key_4 has the authority to access the data stored at the secured memory zones memZ1~memZ7 and the normal access region 331. As the bit Bit_8 of the configuration setting circuit cfgREG_4 is not set (Bit_8=0), the user having the access key key_4 cannot access the data stored at the secured memory zone memZ8.

According to Table 1, the memory zone memZ1 can be accessed with the access keys key_3, key_4; the memory zone memZ2 can be accessed with the access key key_4; the memory zone memZ3 can be accessed with the access keys key_1, key_4; the memory zone memZ4 can be accessed with the access keys key_3, key_4; the memory zone memZ5 can be accessed with the access keys key_1, key_4; the memory zone memZ6 can be accessed with the access keys key_2, key_4; the memory zone memZ7 can be accessed with the access keys key_1, key_4; and the memory zone memZ8 cannot be accessed with any of the access keys key_1~key_4.

Table 1 and FIG. 6A shows that the mappings between each configuration setting circuits cfgREG_1~cfgREG_4 and the secured memory zones memZ1~memZ8 are individually set. With the layout in FIG. 6A, the mapping information stored at the configuration setting circuits cfgREG_1~cfgREG_4 can cover the mapping relationships shown in FIGS. 2A, 2B, and 2C.

FIG. 6B is a schematic diagram illustrating that the mapping circuit and the backup circuit have a memory-zone centralized layout. The backup circuit 513a includes M configuration storage circuits cfgSTG_1~cfgSTG_M, and the mapping circuit 513c includes M configuration setting circuits cfgREG1~cfgREG_M. In FIG. 6B, each of the configuration storage circuits cfgSTG_1~cfgSTG_M includes K bits, so as the configuration setting circuits cfgREG1~cfgREG_M. On the right side of FIG. 6B, the configuration setting circuits cfgREG_1, cfgREG_n, cfgREG_N are shown as examples.

The number of access keys key_1~key_N can by represented by K bits, with a binary code representation. Assuming that four access keys key_1~key_4 (N=4) are used, then two bits (K=2) are required (N=2 K). It is assumed that N is smaller than or equivalent to two to K-th power. Table 2 shows that the access key key_1 corresponds to 0b 00, the access key key_2 corresponds to 0b 01, the access key key_3 corresponds to 0b 10, and the access key key_4 corresponds to 0b 11.

TABLE 2

| access key | Bit_2 | Bit_1 |
|---|---|---|
| key_1 | 0 | 0 |
| key_2 | 0 | 1 |
| key_3 | 1 | 0 |
| key_4 | 1 | 1 |

Table 3 shows a set of exemplary values stored at the configuration setting circuits cfgREG1~cfgREG_N. In Table 2, it is assumed that K=2, M=8, and N=4.

TABLE 3

| configuration setting circuit | secured memory zone | (optional) Bit_3 | Bit_2 | Bit_1 |
|---|---|---|---|---|
| cfgREG_1 | memZ1 | 1 | 0 | 1 |
| cfgREG_2 | memZ2 | 1 | 0 | 0 |
| cfgREG_3 | memZ3 | 0 | 1 | 0 |
| cfgREG_4 | memZ4 | 0 | 0 | 1 |
| cfgREG_5 | memZ5 | 1 | 1 | 1 |
| cfgREG_6 | memZ6 | 1 | 0 | 1 |
| cfgREG_7 | memZ7 | 1 | 1 | 0 |
| cfgREG_8 | memZ8 | 0 | 0 | 0 |

As four access keys key_1~key_4 are provided, each configuration setting circuit cfgREG1~cfgREG_8 needs at least two bits to represent. The bit settings of Bit_2, Bit_1 of the configuration setting circuits cfgREG_1~cfgREG_8 in Table 3 are based on the bit settings of access keys key_1~key_4 listed in Table 2.

Furthermore, the configuration setting circuits cfgREG_1~cfgREG_M and the configuration storage circuits cfgSTG_1~cfgSTG_M might have an extra bit (an optional bit). It is assumed that the optional bit is the most significant bit (hereinafter, MSB) in Table 3 and FIG. 6B. However, the actual position of the optional bit is not limited.

When the configuration setting circuits cfgREG_1~cfgREG_M and the configuration storage circuits cfgSTG_1~cfgSTG_M have the optional bit, the access control circuit 312 utilizes the optional bit to represent whether the secured memory zone memZ1~memZM is enabled or disabled. That is, a secured memory zone is enabled for access only if the extra bit (Bit_3) of its corresponding configuration setting circuits cfgREG_1~cfgREG_M and the configuration storage circuits cfgSTG_1~cfgSTG_M are set. If the extra bit (Bit_3) of the configuration setting circuits cfgREG_1~cfgREG_M and the configuration storage circuits cfgSTG_1~cfgSTG_M corresponding to the secured memory zone memZ1~memZM is not set, it implies that the secured memory zone memZ1~memZM is reserved and none of the users can access the data stored at the secured memory zone memZ1~memZM.

For example, in Table 3, the extra bits (Bit_3) of the configuration setting circuits cfgREG_3, cfgSTG_4, cfgSTG_8 are set to 0. This implies that the secured memory zones memZ3, memZ4, and memZ8 are reserved. Alternatively speaking, none of the access keys key_1~key_4 can be utilized to access the data stored at the secured memory zones memZ3, memZ4, and memZ8, and the access control circuit 312 should ignore the values of the bits Bit_2, Bit_1 in the configuration setting circuits cfgREG_3, cfgREG_4, and cfgREG_8.

According to Table 3, the optional bits of the secured memory zones memZ1, memZ2, memZ5, memZ6, and memZ7 are set to 1. Therefore, the secured memory zones memZ1, memZ2, memZ5, memZ6, and memZ7 can be accessed if their corresponding access keys key_1~key_4 are received from the host device 10. Please refer to Tables 2 and 3 together.

The configuration setting circuit cfgREG_1 corresponds to the secured memory zone memZ1, and the value (0b 01) stored at the configuration setting circuit cfgREG_1 corresponds to the access key key_2. Thus, the secured memory zone memZ1 can be accessed when the host device 10 transmits the access key key_2 to the memory device 3.

The configuration setting circuit cfgREG_2 corresponds to the secured memory zone memZ2, and the value (0b 00) stored at the configuration setting circuit cfgREG_2 corresponds to the access key key_1. Thus, the secured memory zone memZ2 can be accessed when the host device 10 transmits the access key key_1 to the memory device 3.

The configuration setting circuit cfgREG_5 corresponds to the secured memory zone memZ5, and the value (0b 11) stored at the configuration setting circuit cfgREG_5 corresponds to the access key key_4. Thus, the secured memory zone memZ5 can be accessed when the host device 10 transmits the access key key_4 to the memory device 3.

The configuration setting circuit cfgREG_6 corresponds to the secured memory zone memZ6, and the value (0b 01) stored at the configuration setting circuit cfgREG_6 corresponds to the access key key_2. Thus, the secured memory zone memZ6 can be accessed when the host device 10 transmits the access key key_2 to the memory device 3.

The configuration setting circuit cfgREG_7 corresponds to the secured memory zone memZ7, and the value (0b 10) stored at the configuration setting circuit cfgREG_7 corresponds to the access key key_3. Thus, the secured memory zone memZ7 can be accessed when the host device 10 transmits the access key key_3 to the memory device 3.

According to Table 3, the relationships between the access keys key_1~key_3 and the secured memory zones memZ1, memZ2, memZ5, memZ6, memZ7 can be summarized below. The secured memory zone memZ2 can be accessed when the access key key_1 (0b 00) is received. The secured memory zones memZ1, memZ6 can be accessed when the access key key_2 (0b 01) is received. The secured memory zone memZ7 can be accessed when the access key key_3 (0b 10) is received. The secured memory zone memZ5 can be accessed when the access key key_4 (0b 11) is received.

Please further note that, according to Table 3, each of the secured memory zone memZ1~memZ8 may correspond to one and only one access key key_1~key_4. Whereas it is possible that one access key key_1~key_4 corresponds to more than one secured memory zone memZ1~memZ8. Alternative speaking, when the mapping information is presented with the pattern of Table 3, the memory device 3 supports the one-to-one mapping (FIG. 2A), the one-to-many mapping (FIG. 2B), and a combination of the one-to-one mapping and the one-to-many mapping (FIGS. 2A and 2B).

The above illustrations demonstrate that the access control of the secured memory zones can be freely adjusted, depending on the needs of the users. The correspondences between different access keys and the secured memory zones are independently set in the mapping creation procedure. Later, in the mapping search procedure, the correspondences between different access keys and the secured memory zones are referred to manage access control of the secured memory zone. Therefore, the memory device, according to the embodiment of the present disclosure, could have high flexibilities in response to different requirements of the users. With such mechanism, the access authority specific to the memory device can be carefully managed and assured.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising: a non-volatile memory array, comprising:
M secured memory zones; and
a memory control circuit, electrically connected to the non-volatile memory array, comprising:
a mapping circuit, configured to provide a set of mapping information representing correspondences between N access keys and the M secured memory zones, wherein M and N are positive integers;
a backup circuit, electrically connected to the mapping circuit, configured to store a copy of the set of mapping information; and
an access control circuit, electrically connected to the mapping circuit and the backup circuit, configured to search the set of mapping information to identify if a request key is stored in the set of mapping information,
wherein the access control circuit performs an access command to acquire at least one of the M secured memory zones if the request key is one of the N access keys, and
the access control circuit copies the set of mapping information from the mapping circuit, and the backup circuit stores the copy of the set of mapping information before the memory device is powered off or after the set of mapping information is updated.

2. The memory device according to claim 1, wherein M is equivalent to N.

3. The memory device according to claim 1, wherein M is greater than N.

4. The memory device according to claim 1, wherein the mapping circuit comprises N configuration setting circuits, and the N configuration setting circuits respectively correspond to the N access keys.

5. The memory device according to claim 4, wherein each of the N configuration setting circuits comprises M bits, and the M bits respectively correspond to the M secured memory zones.

6. The memory device according to claim 1, wherein the mapping circuit comprises M configuration setting circuits, and the M configuration setting circuits respectively correspond to the M secured memory zones.

7. The memory device according to claim 6, wherein each of the M configuration setting circuits comprises K bits, wherein K is a positive integer, and N is smaller than or equivalent to two to a K-th power.

8. The memory device according to claim 6, wherein each of the M configuration setting circuits comprises an optional bit, wherein the optional bit in an m-th configuration setting circuit among the M configuration circuits represents whether an m-th secured memory zone among the M secured memory zones can be accessed, wherein m is a positive integer, and m is smaller than or equivalent to M.

9. The memory device according to claim 1, wherein the access control circuit creates the set of mapping information at the mapping circuit before the request key is received.

10. The memory device according to claim 1, wherein the mapping circuit is implemented with volatile memories, and the backup circuit is implemented with non-volatile memories.

11. The memory device according to claim 10, wherein the mapping circuit is implemented with registers, latches, or static random access memories.

12. The memory device according to claim 1, wherein the set of mapping information is copied from the backup circuit to the mapping circuit after the memory device is powered on.

13. The memory device according to claim 1, wherein a layout of the mapping circuit is similar to a layout of the backup circuit.

14. The memory device according to claim 1, wherein the set of mapping information is created before the M secured memory zones is accessed first time.

15. The memory device according to claim 1, wherein the memory control circuit is electrically connected to a host device, and the host device sends the access command and the request key to the memory control circuit.

16. A control method applied to a memory device comprising a non-volatile memory array and a memory control circuit, wherein the non-volatile memory array comprises M secured memory zones, the memory control circuit comprises a mapping circuit, a backup circuit, and an access control circuit, and the control method comprises steps of:
the mapping circuit providing a set of mapping information representing correspondences between N access keys and the M secured memory zones;
the access control circuit storing a copy of the set of mapping information to the backup circuit before the memory device is powered off or after the set of mapping information is updated;
the access control circuit searching a request key in the set of mapping information to identify if the request key is one of the N access keys; and
the access control circuit performing an access command to acquire at least one of the M secured memory zones if the request key is one of the N access keys, wherein M and N are positive integers.

17. A memory device, comprising:
a non-volatile memory array, comprising:
M secured memory zones; and
a memory control circuit, electrically connected to the non-volatile memory array, comprising:
a mapping circuit, configured to provide a set of mapping information representing correspondences between N access keys and the M secured memory zones, wherein M and N are positive integers;
a backup circuit, electrically connected to the mapping circuit, configured to store a copy of the set of mapping information; and
an access control circuit, electrically connected to the mapping circuit and the backup circuit, configured to search the set of mapping information to identify if a request key is stored in the set of mapping information, wherein
the access control circuit performs an access command to acquire at least one of the M secured memory zones if the request key is one of the N access keys, wherein
the access control circuit copies the set of mapping information from the mapping circuit, and the backup circuit stores the copy of the set of mapping information before the memory device is powered off or after the set of mapping information is updated.

18. The memory device according to claim 17, wherein the access control circuit locks the backup circuit after the copy of the set of mapping information is stored at the backup circuit.

* * * * *